US009995815B2

(12) United States Patent
Beiner et al.

(10) Patent No.: US 9,995,815 B2
(45) Date of Patent: Jun. 12, 2018

(54) ENERGY METERING SYSTEM AND METHOD FOR ITS CALIBRATION

(71) Applicant: Energybox Ltd., Wanchai (HK)

(72) Inventors: Dirk Beiner, Paderborn (DE); Mihail Mastroyiannis, Clearwater Bay (HK); Wing Kin Louie, Shatin (HK)

(73) Assignee: ENERGYBOX LTD., Wanchai (HK)

( * ) Notice: Subject to any disclaimer, the term of this patent is extended or adjusted under 35 U.S.C. 154(b) by 0 days. days.

(21) Appl. No.: 14/586,740

(22) Filed: Dec. 30, 2014

(65) Prior Publication Data

US 2016/0187449 A1    Jun. 30, 2016

(51) Int. Cl.
| | |
|---|---|
| *G01R 33/09* | (2006.01) |
| *G01R 15/18* | (2006.01) |
| *G01R 35/00* | (2006.01) |
| *G01R 21/133* | (2006.01) |
| *G01R 35/04* | (2006.01) |
| *G01R 15/20* | (2006.01) |
| *G01R 22/10* | (2006.01) |

(52) U.S. Cl.
CPC ......... *G01R 35/005* (2013.01); *G01R 15/207* (2013.01); *G01R 21/133* (2013.01); *G01R 22/10* (2013.01); *G01R 35/04* (2013.01)

(58) Field of Classification Search
CPC .... G01R 19/0092; G01R 33/09; G01R 15/18; G01R 15/207; G01R 33/093; G01R 21/00; G01R 33/07; G01R 15/181; G01R 21/133; G01R 19/2513; H04Q 9/00; H04Q 2209/60; H04Q 2209/40

USPC ..... 324/117 R, 117 H, 126–127, 142, 130 R, 324/251–252; 340/870.01–870.03; 702/60, 62, 64–65
See application file for complete search history.

(56) References Cited

U.S. PATENT DOCUMENTS

| | | | |
|---|---|---|---|
| 4,518,957 A | 5/1985 | Wheeler | |
| 4,611,201 A | 9/1986 | Guim et al. | |
| 4,706,073 A * | 11/1987 | Vila Masot | ......... G08B 21/185 |
| | | | 340/639 |
| 5,699,276 A | 12/1997 | Roos | |

(Continued)

FOREIGN PATENT DOCUMENTS

| | | |
|---|---|---|
| DE | 102007047920 A1 | 12/2008 |
| EP | 0782002 A1 | 7/1997 |

(Continued)

*Primary Examiner* — Jermele M Hollington
*Assistant Examiner* — Taqi Nasir
(74) *Attorney, Agent, or Firm* — Slater Matsil, LLP

(57) ABSTRACT

An energy metering system includes a plurality of sensors arranged in proximity to circuit breakers of a distribution panel for sensing a magnetic field in the area of the circuit breakers and providing corresponding sensor data. The system further includes a data processing system for converting the sensor data of the plurality of sensors into electrical load information for a plurality of electrical circuits protected by corresponding circuit breakers. The system further includes a calibration unit configured to determine at least a reference voltage and a reference current of at least one circuit. The data processing system is configured to calibrate a relationship between the sensor data and the load information based on the reference voltage and reference current determined by the calibration device in a calibration mode of the energy metering system.

24 Claims, 5 Drawing Sheets

(56) References Cited

U.S. PATENT DOCUMENTS

| | | |
|---|---|---|
| 5,877,691 A | 3/1999 | Suptitz et al. |
| 6,330,516 B1 | 12/2001 | Kammeter |
| 8,344,724 B2 | 1/2013 | Leeb et al. |
| 8,350,417 B1 | 1/2013 | Dooley et al. |
| 8,805,628 B2 | 8/2014 | Patel et al. |
| 8,930,152 B2 | 1/2015 | Patel et al. |
| 9,054,516 B2 | 6/2015 | Watford |
| 2003/0050737 A1 | 3/2003 | Osann, Jr. |
| 2003/0216877 A1 | 11/2003 | Culler et al. |
| 2003/0225482 A1 | 12/2003 | Topka et al. |
| 2005/0097373 A1 | 5/2005 | Stoupis et al. |
| 2006/0082468 A1 | 4/2006 | Wang et al. |
| 2008/0255782 A1 | 10/2008 | Bilac et al. |
| 2009/0115426 A1 | 5/2009 | Muench, Jr. et al. |
| 2009/0271725 A1 | 10/2009 | Dirla |
| 2010/0020724 A1 | 1/2010 | Wimmer et al. |
| 2010/0076615 A1 | 3/2010 | Daniel et al. |
| 2010/0094475 A1 | 4/2010 | Masters et al. |
| 2010/0256934 A1* | 10/2010 | Rohrbaugh ........ G01R 31/3278 702/62 |
| 2010/0264906 A1 | 10/2010 | Shamir et al. |
| 2011/0029149 A1 | 2/2011 | Wimmer |
| 2011/0074382 A1 | 3/2011 | Patel |
| 2011/0208450 A1 | 8/2011 | Salka et al. |
| 2011/0251807 A1 | 10/2011 | Rada et al. |
| 2012/0054125 A1 | 3/2012 | Clifton et al. |
| 2012/0062249 A1 | 3/2012 | Shamir |
| 2012/0068692 A1* | 3/2012 | Patel ................... G01R 15/207 324/202 |
| 2012/0271576 A1 | 10/2012 | Kamel et al. |
| 2013/0039034 A1* | 2/2013 | Baer ..................... H02B 1/306 362/95 |
| 2013/0119972 A1* | 5/2013 | Maguire .............. G01R 35/005 324/74 |
| 2013/0187636 A1 | 7/2013 | Kast et al. |
| 2013/0229173 A1* | 9/2013 | Bertrand .............. G01R 15/207 324/202 |
| 2013/0254896 A1* | 9/2013 | Helmschmidt ......... G06F 21/64 726/26 |
| 2013/0271111 A1 | 10/2013 | Makanawala |
| 2013/0271895 A1 | 10/2013 | Kuhns |
| 2013/0320776 A1 | 12/2013 | Cook |
| 2014/0055886 A1* | 2/2014 | Spangenberg ......... H01H 33/26 361/2 |
| 2014/0170971 A1 | 6/2014 | Walsh et al. |
| 2014/0210453 A1* | 7/2014 | El-Essawy ........... G01R 15/142 324/126 |
| 2015/0193982 A1 | 7/2015 | Mihelich et al. |

FOREIGN PATENT DOCUMENTS

| | | | |
|---|---|---|---|
| EP | 1107274 A1 * | 6/2001 | ......... H01H 71/0228 |
| EP | 2040280 A2 | 3/2009 | |
| EP | 2648313 A2 | 10/2013 | |
| KR | 20120058953 A * | 6/2012 | ............. H02B 15/00 |
| WO | 03073176 A1 | 9/2003 | |
| WO | 2009052121 A2 | 4/2009 | |
| WO | 2010119332 A1 | 10/2010 | |
| WO | 2011103593 A1 | 8/2011 | |
| WO | 2012003492 A2 | 1/2012 | |
| WO | 2012007831 A2 | 1/2012 | |
| WO | 2012099588 A1 | 7/2012 | |
| WO | 2012103138 A1 | 8/2012 | |

* cited by examiner

ENERGY METERING SYSTEM AND METHOD FOR ITS CALIBRATION

CROSS REFERENCE TO RELATED APPLICATIONS

The present application is related to the following related applications. Co-pending U.S. application Ser. No. 14/586,710, filed Dec. 30, 2014, titled "Energy metering system with self-powered sensors" and co-pending U.S. application Ser. No. 14/586,696, filed Dec. 30, 2014, titled "Visualization of electrical loads" disclose further aspects of the inventive energy metering system disclosed herein. Application EBL-001 provides details regarding the powering of the sensors of the sensor system. Application EBL-002 provides details regarding the visualization of sensor data obtained by the metering system. The disclosure of these applications is incorporated herein by reference.

TECHNICAL FIELD

The present invention relates to energy metering systems for determining electrical loads of a distribution panel. In particular, the present invention relates to an energy metering system capable of determining electrical loads on a per circuit basis. The invention further relates to methods and devices for operating energy metering systems, and in particular to a method for calibrating an energy metering system capable of determining electrical loads on a per circuit basis and a data aggregation device.

BACKGROUND

In conventional energy distribution networks, the energy consumption of a site is typically measured at a central supply point, e.g. between a supply line of the energy supplier and the first distribution panel of a given site, for example a single building or a distinct part of a building such as an apartment or the like. In this way, all electrical energy consumed at that particular site can be measured, irrespective of the electrical distribution system of the given site.

Conventional energy metering devices locally record the total use of electrical energy. Such energy metering systems need to be read at regular intervals by the energy consumer, the energy provider or a service company. More recently, so-called smart metering devices have been introduced in several countries. In a smart metering system, a smart metering device communicates the amount of energy consumed at a particular site back to a utility provider, e.g. the energy provider or a service company. In some instances, the amount of energy consumed is reported on request only, e.g. for preparation of a utility bill. Other smart energy metering systems allow a more regular feedback of energy consumption data, for example every day or every hour.

Reporting an energy consumption back to the utility provider at regular intervals allows the implementation of new charging policies. For example, energy consumers may be rewarded with lower prices by an energy provider if they avoid excessive energy consumption in times of high demand, and instead shift their energy consumption to periods of low demand, such as the night.

While such systems are useful on a macroscopic level, in many cases, energy metering systems measuring the energy consumption of a relatively large site at a single point are insufficient in order to analyze the energy consumption of a single user in detail. For example, a user may detect that he or she uses an above-average amount of energy at a particular time of the day but may be unable to detect where in the house or apartment this energy is consumed.

To overcome this problem, devices have been developed that allow the measurement of the electrical load of a particular device. Such devices can either be installed fixedly at relevant points of an energy distribution network or may be provided as an intermediate device, plugged in between a wall outlet and a device under scrutiny. While these devices are useful in identifying electrical devices causing a particularly high electrical load, their installation and use is relatively complex, leading to either high installation cost or limited use.

In this context, it is a challenge of the present invention to describe energy metering systems and associated methods for their operation that allow an energy consumer or an utility provider to obtain a more detailed assessment of the electric energy consumption at a particular site. Preferably, the energy metering system should be easy to deploy and operate.

SUMMARY

According to one aspect of the invention, an energy metering system for determining electrical loads of a distribution panel is provided. The energy metering system comprises a plurality of sensors arranged in proximity to circuit breakers of the distribution panel for sensing a magnetic field in the area of the circuit breakers and for providing corresponding sensor data. The system further comprises a data processing system for converting the sensor data of the plurality of sensors into electrical load information for a plurality of electrical circuits protected by corresponding circuit breakers. In addition, the system comprises a calibration unit electrically connected to one of the plurality of circuits and coupled with the data processing system, wherein the calibration unit is configured to determine at least a reference voltage and a reference current of the connected circuit. The data processing system is configured to calibrate a relationship between the sensor data and the load information based on the reference voltage and reference current determined by the calibration device in a calibration mode of the energy metering system.

According to another aspect of the present invention, a method for calibrating an energy metering system is provided. The method comprises the steps of determining a reference voltage and a reference current of a first circuit branching off an electrical distribution panel, and sensing a magnetic field in the area of a first circuit breaker configured to protect at least the first circuit and providing corresponding first sensor data. The method further includes determining first electrical load information for the first circuit based on the measured reference voltage and reference current, and determining calibration data representative of a relationship between the provided first sensor data and the determined first electrical load information. Based on the determined calibration data, second sensor data corresponding to a magnetic field in the area of a second circuit breaker is converted into second load information in a normal operating mode of the energy metering system.

According to a third aspect, a data aggregation device for an energy metering system is provided. The device comprises at least one bus connector for connecting a plurality of sensors arranged in proximity to circuit breakers of an electrical distribution panel for sensing a magnetic field in the area of the circuit breakers to the data aggregation device. The device further comprises at least one plug connector for connecting the data aggregation device to a first circuit branching off the electrical distribution panel and a calibration unit electrically connected to the plug connector. The calibration unit comprises a circuit for determining a reference voltage and a reference current of the first circuit. The system further comprises at least one interface for providing sensor data provided by the plurality of sensors and a reference current and reference voltage determined by the calibration unit for calibrating a relationship between the provided sensor data and electrical load information for the first circuit in a calibration mode and for converting the provided sensor data into electrical load information of a plurality of electrical circuits protected by corresponding circuit breakers in a normal operation mode of the energy metering system.

The described system, method and device enable a more in-depth analysis of electrical loads at a particular site. In addition, the described system is particularly easy to set up, even by a consumer.

BRIEF DESCRIPTION OF THE DRAWINGS

Various embodiments of the present invention will be described with reference to the attached drawings. In the drawings, like reference symbols are used for like elements of different embodiments. The attached drawings include.

DETAILED DESCRIPTION OF ILLUSTRATIVE EMBODIMENTS

Figure 1:
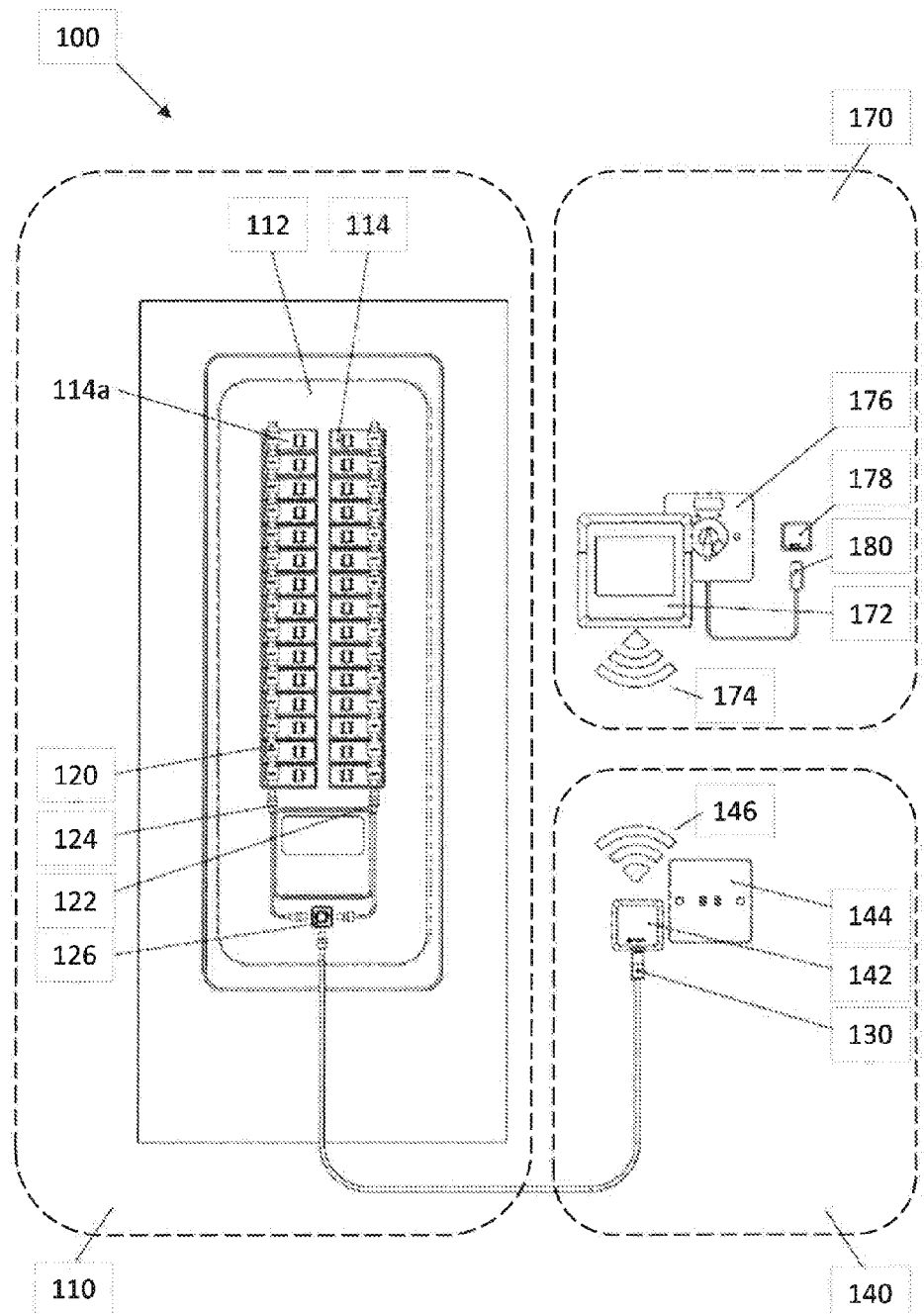
FIG. 1 shows a schematic diagram of an energy metering system in accordance with an embodiment of the invention.

FIG. 1 shows a schematic diagram of an energy metering system 100 in accordance with an embodiment of the present invention. The energy metering system 100 comprises three sub-systems, a sensor sub-system 110, a data collection sub-system 140 and a data analysis sub-system 170. In other embodiments, several of these sub-systems may be omitted, combined or separated into further sub-systems. For example, the analysis-subsystem 170 may not be present at a customer site, but may be implemented as a cloud-based web-service by a utility provider.

In accordance with the described embodiment, the sensor sub-system 110 is fitted directly onto a conventional electrical distribution panel 112 or into an enclosing fuse box. In the embodiment shown in FIG. 1, the distribution panel 112 comprises two rows of vertically arranged circuit breakers 114. Of course, in other embodiments, the circuit breakers 114 may be arranged horizontally or in a different number of rows and columns. Each circuit breaker 114 is connected inside the distribution panel 112 to a supply line and connected with one of several circuits of a particular site, such as an apartment or a house. In the described embodiment, the row of circuit breakers 114 comprises a mains circuit breaker 114a protecting the entire electrical distribution panel 112, and thus all secondary circuit breakers 114 and associated circuits connected to it. For example, a first secondary circuit breaker 114 may be connected to a first circuit supplying the wall sockets of a bedroom with electrical energy. A second secondary circuit breaker 114 may be connected with a second circuit for supplying the wall sockets of a kitchen with electrical energy. A third secondary circuit breaker 114 may be connected directly to a particular powerful electrical appliance, such as an oven, a heater or an air conditioning system.

In order to obtain load information for each individual circuit, in the described embodiment, a sensor 120 is fitted to each one of the circuit breakers 114, including the mains circuit breaker 114a. Each sensor 120 is configured for sensing the strength of a magnetic field in the area of the respective circuit breaker 114, such as the magnetic field emitted by a protection coil or other internal component of the circuit breaker 114. In particular, a single-chip synchronous three-axis digital magnetometer configured for determining components of a magnetic field or flux in three different spatial directions may be employed. Such sensors are known, for example, from application US 2013/0229173 A1 of Paul Bertrand, the content of which is incorporated herein by reference, and are therefore not described in detail here.

For ease of installation, several of the sensors 120 may be combined to form a sensor device in the form of a sensor strip. Preferably, the individual sensors 120 of a sensor strip may be spaced in accordance with a standardized spacing of circuit breakers 114. In order to accommodate variations in the spacing of the circuit breakers 114, a flexible strip may be used to connect the individual sensors 120. Alternatively, individual sensor devices may be used. The row of sensors may also comprise dummy sensors, i.e. devices having compatible electrical connections and physical dimensions as the sensors 120 described above. Such dummy sensors may be placed between sensors 120 in places where no circuit breaker 114 is present. Moreover, a single housing of a sensor device may comprise two or more sensors 120, in case double or tandem circuit breakers are installed at the distribution panel 112.

In the described embodiment, each sensor device has an associated microcontroller for operating the sensor 120. This may include enforcing an appropriate timing of each measurement with respect to an external clock signal. The microcontroller may also perform data pre-processing, such as digitizing analog measurement results and rejecting obviously incorrect measurements. In case sensor strips or sensor casings with more than one sensor 120 are employed, a single microcontroller may be shared by multiple sensors 120.

In the described embodiment, each sensor 120 comprises a status indicator in form of a light emitting diode (LED). The LED can be controlled by the microcontroller to indicate an operational state of the sensor 120. Depending on the number of states to be signaled, a single color LED or a multicolor LED may be used. The LED may also be used during initial configuration of the energy metering system 100 as described below. Furthermore, the LED may be used for more advanced applications, as described in more detail in EBL-002.

In one embodiment, the sensor devices are attached to the individual circuit breakers 114 by means of an adhesive strip or an adhesive layer on the back of a housing of the sensor devices. Other attachment means, such as elastic clips configured to clip onto a standardized housing of a circuit breaker 114 or a frame that is laid over the circuit breaker 114 including sensor electronics and an area for placing individual marker or label information, may be employed. Such mechanical attachment means ensure a consistent placement of a sensor 120 on top of a circuit breaker 114 at a specific location, corresponding, for example, to an emission hotspot of a magnetic field. The accurate placement of the sensors 120 at a well-defined position improves the comparability of the measurements obtained by different sensors 120.

The individual sensors 120 are connected by an internal bus system not visible in FIG. 1. The bus system may be a parallel bus system having a plurality of parallel bus lines connected to each one of the row of sensors 120. Alternatively, the bus system may also be configured as a daisy chain, i.e. for forwarding data from one sensor 120 to the next. In the described embodiment, the bus system combines both architectures. In particular, a first part of the bus comprising power supply, data and clock lines is connected in parallel to all sensors 120. Among others, this allows to synchronize the operation of all sensors 120 of the sensor sub-system 110. A second part of the bus comprises address lines for connecting all sensors 120 of a row of sensors in a daisy chain configuration, allowing to sequentially address each one of the sensors 120 in order.

At one end of each row of sensors 120, connection cables 122 and 124 are connected to the first sensor 120 of that column. In the depicted embodiment, the connection cables 122 and 124 are connected to a junction box 126. As detailed above with respect to the sensors 120, the junction box 126 is preferably fitted to the distribution panel 112 by means of an adhesive tape, an adhesive layer or a magnetic fixture such that it can be fitted without opening the distribution panel 112 and without specialized tools. In another embodiment, the last sensor 120 of a first row of sensors 120 may be connected directly to a first sensor 120 of a further row of sensors 120, such that all sensors 120 form a single chain of sensors 120.

The sensor sub-system 110 may comprise further components not visible in FIG. 1. For example, the sensor sub-system 110 may comprise as a motion detector detecting the presence of a person in proximity to the distribution panel, or a front door sensor detecting an opening state of a covering door of a fuse box enclosing the distribution panel 112. Such additional sensor data may be used by the energy metering system 100 to interrupt the load measurement in case maintenance is performed at the distribution panel 112, which may cause incorrect measuring results. Alternatively, data from such sensors may also be used to trigger a recalibration of the energy metering system 100 as described further below. A recalibration can be used to adapt the energy metering system 100 to a changed configuration or other external influences, such as a different background magnetic field. In addition, different sets of calibration data may be stored for different operation environments, e.g. with an open or closed fuse box. In this case, data from a door sensor may be used to switch the sets of calibration data accordingly to improve the measuring results. Moreover, the energy metering system 100 may generate a notification to a user or administrator to highlight that the door has been opened or left open.

The sensor sub-system 110, comprising the sensors 120, the connection cables 122 and 124 as well as the junction box 126, is connected to the data collection sub-system 140 by means of a feed cable 130. In particular, the feed cable 130 is plugged into the junction box 126 at one end and into a local data aggregation device 142 at the other end.

In the described embodiment, the data aggregation device 142 is integrated into an AC adapter type housing with a plug connector for plugging the data aggregation device 142 into a conventional wall socket 144. Plugging the data aggregation device 142 into the wall socket 144 powers up the data collection sub-system 140 and the connected sensor sub-system 110. Moreover, plugging the data aggregation device 142 into the wall socket 144 also connects the data aggregation device 142 to a circuit branching off the distribution panel 112. This in turn allows an automatic calibration of the energy metering system to take place as described in more detail later.

Although not shown in FIG. 1, the data aggregation device may comprise further interfaces for connecting other sensors to the energy metering system 100. For example, the data aggregation device 142 may comprise a plug connector or wireless interface for collecting data from other utility or home automation sensors, such as a gas meter, a water meter, or a heat meter. This data may also be recorded together with the electric load information in order to enable a combined power metering and billing for the site.

In the embodiment of FIG. 1, the data collection sub-system 140 is arranged in proximity to the distribution panel 112, e.g. in the same room, but outside of the distribution panel 112 or a surrounding fuse box itself. In contrast, the data analysis sub-system 170 is arranged at a different location. For example, the distribution panel 112, the sensor sub-system 110 and the data collection sub-system 140 may be installed in a basement, a garage or another hard to reach place of a building. In contrast, the data analysis sub-system 170 may be installed in a corridor, an office or a living room inside that building. In other embodiments, the data collection sub-system 140 and/or the data analysis sub-system 170 may be integrated into the distribution panel 112.

In order to establish a data link between the data collection sub-system 140 and the data analysis sub-system 170, the data aggregation device 142 comprises a wireless transmission system 146, such as a Wi-Fi link in accordance to IEEE standard family 802.11. In the embodiment of FIG. 1, the data analysis sub-system 170 comprises a remote terminal 172 with a corresponding wireless transmission system 174. Alternatively, the data aggregation device 142 and the remote terminal 172 may also be connected by means of a direct cable connection or another suitable data transmission system. In particular in case the data aggregation device 142 is integrated into the distribution panel 112, a power line communication may be used to avoid problems with wireless data communication from within a fuse box. Moreover, the data aggregation device 142, the terminal 172 and/or other parts used for data processing may be connected to a data network, such as the Internet, for data exchange.

In the described embodiment, the remote terminal 172 is fitted to a wall using a backplate 176, which also provides the terminal 172 with electrical energy by wireless power transmission. Alternatively, the terminal 172 may comprise a built-in energy supply or may be connected to an external power supply by means of a cable. The electrical energy is supplied from an AC/DC adapter 178 connected to the backplate 176 by means of a supply cable 180. The AC/DC adapter 178 may be plugged into any socket at a location where the terminal 172 is to be installed.

In the described embodiment, the terminal 172 performs most of the data processing of the energy metering system 100. In particular, it receives sensor data provided by the sensors 120 regarding the strength of a magnetic field in the area of the individual circuit breakers 114, as well as a reference current and a reference voltage determined by the data aggregation device 142. The processing of the received data by the terminal 172 is described later in more detail. In alternative embodiments, part or all of the processing is performed by other part of the data processing system, e.g. the sensor sub-system 11 or the data-collection sub-system 140. Moreover, some or all of the processing may also be performed by an external entity over a data network, such as a cloud service provided by a utility provider.

In another embodiment, the load information obtained by the terminal 172 is also forwarded to a cloud service arranged in a data network, in particular the Internet (not shown). For this purpose, the terminal may be connected to the data network by means of a network component, for example a modem, a router, or a wireless data network access device. Alternatively, the data aggregation device may forward the load information to the cloud service directly. In this case, the terminal may download the load data from the cloud service rather than from the data aggregation device. The cloud service, which may be provided by the utility provider such as the energy provider or an external service company, comprises a database for storing electrical load information. In the described embodiment, the database comprises current and historical load information of all electricity consumers having a compatible energy metering system 100. In addition, the database 194 may also store further load information, for example load information reported by conventional smart meter devices.

Figure 2:
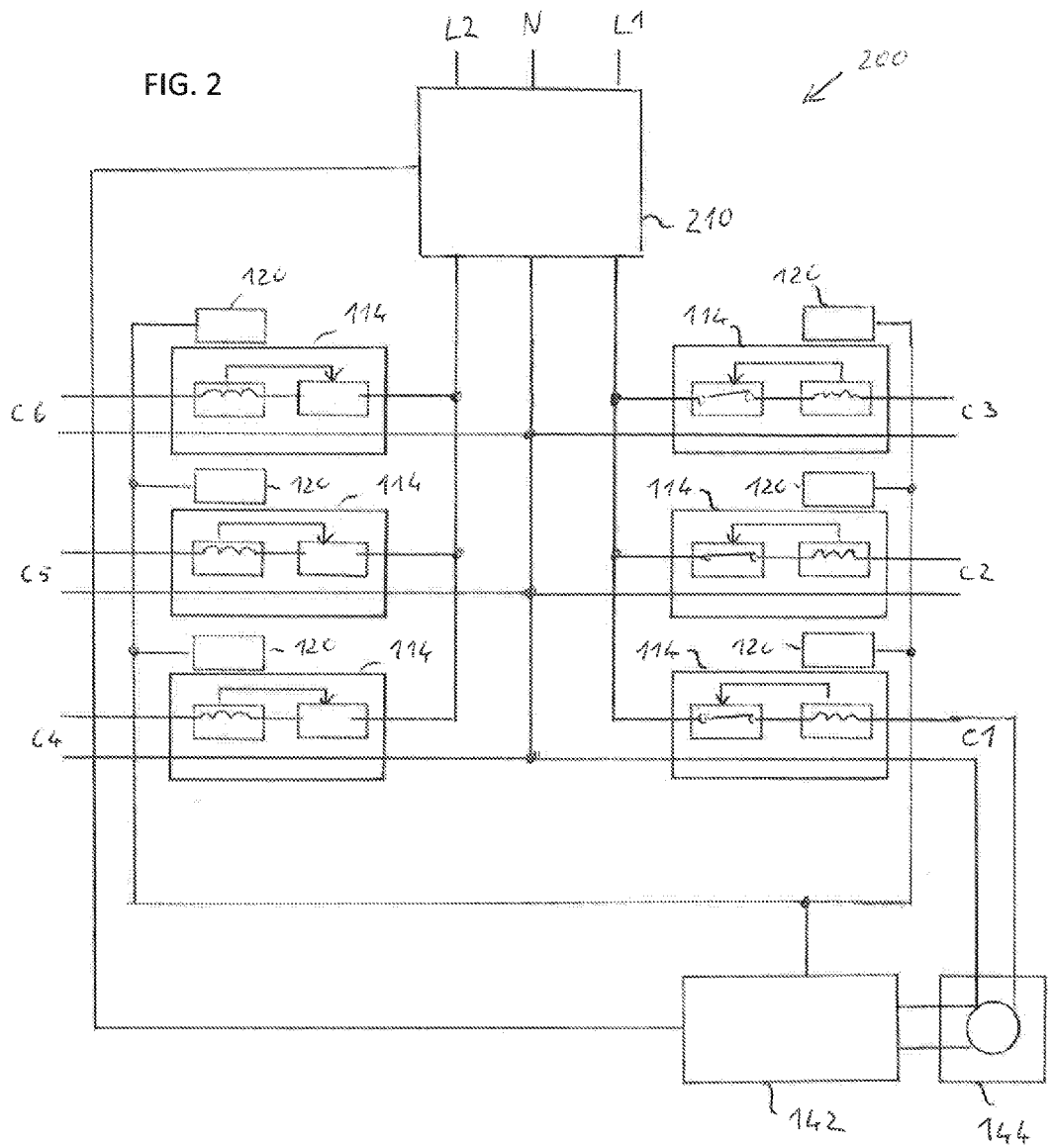
FIG. 2 shows a schematic circuit diagram of an energy distribution system in accordance with an embodiment of the invention.

FIG. 2 shows a schematic circuit diagram of an energy distribution system 200 in an area of an electrical distribution panel 112, for example the distribution panel 112 according to FIG. 1.

In the embodiment shown in FIG. 2, a supply network supplies electrical energy by means of two different phase lines L1 and L2 as well as a neutral conductor N. While FIG. 2 shows a circuit diagram for a dual-phase supply network having a separate neutral conductor N, the person skilled in the art will appreciate that the inventive systems, devices and methods are also applicable to other supply network topologies, including singe-, dual-, three- or multi-phase distribution networks with and without a neutral conductor.

At the distribution panel 112, separate circuits C1 to C6 branch off the two phase lines L1 and L2. In the presented example, three circuits branch off each one of the phase lines L1 and L2. Each of the circuits C1 to C6 is protected by a corresponding circuit breaker 114. Moreover, in the vicinity of each of the circuit breakers 114, a separate sensor 120 for measuring the magnetic flux in the proximity of the circuit breaker 114 is mounted. As the magnetic flux in the area of the circuit breaker 114 is correlated with the current flowing through the circuit C1 to C6, this installation allows to detect a load state of each of the circuits C1 to C6.

As also shown in FIG. 2, circuit C1 is connected to a wall socket 144. Moreover, by means of the wall socket 144, a data aggregation device 142 is also connected to the first circuit C1. As detailed above with respect to FIG. 1, the data aggregation device 142 is also connected with each of the sensors 120. By observing electrical properties of the circuit C1 as well as sensor data provided by a sensor 120 of a corresponding circuit breaker 114, the data aggregation device 142 or a separate data processing system connected to the data aggregation device 142 may establish a correlation between the load of the circuit C1 and the sensor data observed at the corresponding sensor 120. In one approach, the sensor 120 used during calibration may correspond to a sensor placed on an individual circuit breaker protecting the circuit C1 itself. In another approach, a sensor integrated into or attached to a surface of a conventional smart meter or the mains circuit breaker 114*a*, may be considered during calibration as detailed below. Of course, both approaches may be combined, e.g. by calibrating a relationship between a current of the circuit C1 and sensor 120 attached to a mains circuit breaker 114*a* and a related response of a sensor 120 attached to an individual, secondary circuit breaker 114.

Moreover, as the sensors 120 are arranged in close proximity to each other, the correlation established with respect to circuit C1 can also be used in order to establish the electrical load of the other circuits C2 to C6 not directly connected to the data aggregation device 142. For example, a background magnetic field present at all sensors 120 may be identified by comparing predetermined load patterns of circuit C1 with sensor data provided by the first sensor 120. Moreover, interferences between neighboring circuits may be established based on a cross-correlation of the sensor data of the respective sensors 120.

In order to support more precise measurements and, also, to have an independent verification of the load information determined by the data processing system, an overall power consumption of the energy distribution system 200 may be measured by a sum measurement device 210. For example, the further measurement circuit may be a mains circuit breaker 114*a* arranged directly in a supply line leading to a distribution panel 112, a residual-current circuit breaker (RCCB), also known as Ground Fault Circuit Interrupter (GFCI), Ground Fault Interrupter (GFI) or an Appliance Leakage Current Interrupter (ALCI), or a conventional smart meter. The sum measurement device 210 is arranged before the first branch-off point for a particular site and may provide data regarding a current, a voltage and/or power of the energy provided to the power distribution panel 112 for the data aggregation device 142. Such data may be provided by the sum measurement device 210 itself, or a further sensor 120 placed on a surface of the sum measurement device 210. It may be provided directly, i.e. by a cable connection as indicated in FIG. 2, or indirectly, i.e. over a data network, such as a local building automation network or the Internet. Sum measurements provided by the sum measurement device 210 or another measuring device may be compared with the sum of all loads calculated based on the sensor data of each sensor 120. The comparison may be used for verification of the sensor data, for identifying circuits not connected to any circuit breaker 114 or to a circuit breaker having no or a faulty sensor 120 as well as for calibration purposes as described in more detail later.

In order to perform a calibration of the energy metering system 100, a calibration unit is temporarily or permanently connected to the data processing system. The calibration unit may be connected externally, e.g. by means of a plug-in device such as the data aggregation device 142. Alternatively, the calibration unit may be connected internally within the electrical distribution panel 112, e.g. by integration into a sum measurement device 210 or by placing a separate functional unit onto distribution rail arranged within the electrical distribution panel 112.

Figure 3:
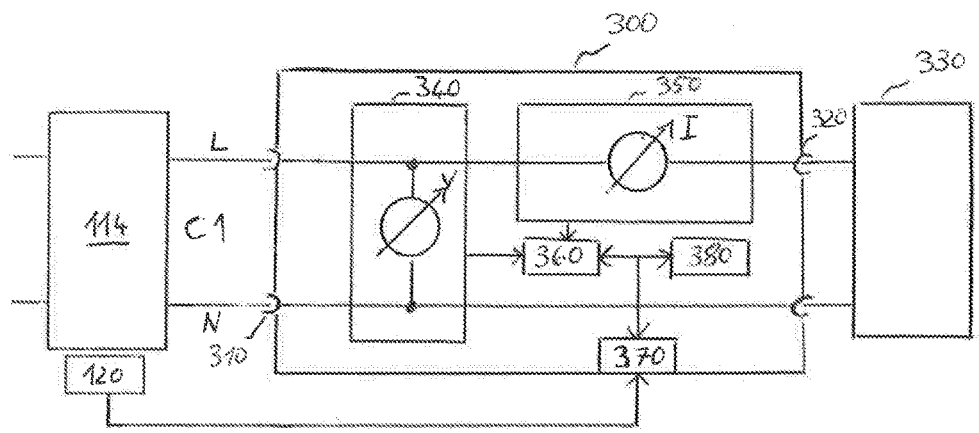
FIG. 3 shows a calibration unit of an energy metering system in accordance with an embodiment of the invention.

FIG. 3 shows a first calibration unit 300 which may be integrated into the distribution panel 112, the data aggregation device 142 or the terminal 172 according to the embodiment of FIG. 1. In the embodiment described with reference to FIG. 3, the calibration unit 300 is integrated into an intermediate device having a plug connector 310 on an input side as well as a socket 320 on an output side. By means of the calibration unit 300, an external load 330 may be connected to circuit C1 branching off an energy distribution system 200. In the schematic circuit diagram shown in FIG.

3, the circuit C1 is protected by a circuit breaker 114 as detailed above with respect to FIGS. 1 and 2.

In order to establish a relationship between the electrical load of the circuit C1 and sensor data provided by a sensor 120 arranged in the proximity of the corresponding circuit breaker 114, the calibration unit 300 comprises a voltage measuring circuit 340 and a current measuring circuit 350. Instead of the internal current measuring circuit shown in FIG. 3, an external current transformer (CT) may be used to measure the current by the external load 330. Various circuit configuration for measuring a voltage and a current of a domestic load such as a heater, an air conditioning system or a washing machine are known from the art. Therefore, a detailed description of the circuits 340 and 350 is omitted.

Attention is drawn to the fact that the load of the electric circuit C1 may depend on further electrical parameters in addition to the voltage measured by the circuit 340 and the current measured by the circuit 350. In particular, inductive or capacitive loads such as electric motors may have an input current that is out of phase with respect to an alternating supply voltage of the circuit C1. In this particular case, in addition to the voltage and current, a phase angle between the input current and input voltage should be established by the calibration unit 300. The phase angle may be established by a separate circuit for measuring the phase angle (not shown in FIG. 3). Alternatively, the phase angle may be determined by sampling the voltage and current with a high sampling frequency compared to the frequency of the alternating supply voltage, i.e. by oversampling, and correlating the sampled data at a later processing stage.

In the embodiment shown in FIG. 3, the calibration unit 300 further comprises a micro-controller 360, an interface 370 and a memory 380 connected by an internal bus system. In order to calibrate the sensor 120, the micro-controller 360 performs a calibration algorithm. The calibration algorithm compares a power consumption of the load 330 calculated based on the reference current and reference voltage provided by the circuit 350 and 340 with sensor data provided by the magnetic sensor 120. In this way, the raw sensor data about the magnetic field in the area of the circuit breakers 114 may be transformed into meaningful load data, such as the electrical current or power flowing through the circuit breaker 114. In other embodiments, the calibration algorithm may be performed by other parts of a data processing system, such as the terminal 172 or a cloud service connected to the energy metering system 100 via the Internet.

Preferably, the comparison is performed with varying external loads 330. For example, the calibration may be performed repeatedly over a prolonged period of time or a user may be instructed to vary the load 330 deliberately during a calibration phase, e.g. by switching on and off the load 330 or switching it into different modes of operation.

Once the calibration unit 300 has established a correlation between the sensor data provided by the sensor 120 via the interface 370 with the reference voltage provided by the voltage measuring circuit 340 and the reference current provided by the current measuring circuit 350, calibration data representative of this correlation is stored in the memory 380 or another suitable memory, e.g. a memory of the corresponding sensor 120, the data aggregation unit 142, the terminal 172 or a database of a cloud service. In the described embodiment, the memory 380 may be a flash memory or a similar non-volatile storage device that will store the established calibration data even in case the calibration unit 300 or the data aggregation device 142 is disconnected from the circuit C1.

Figure 4:
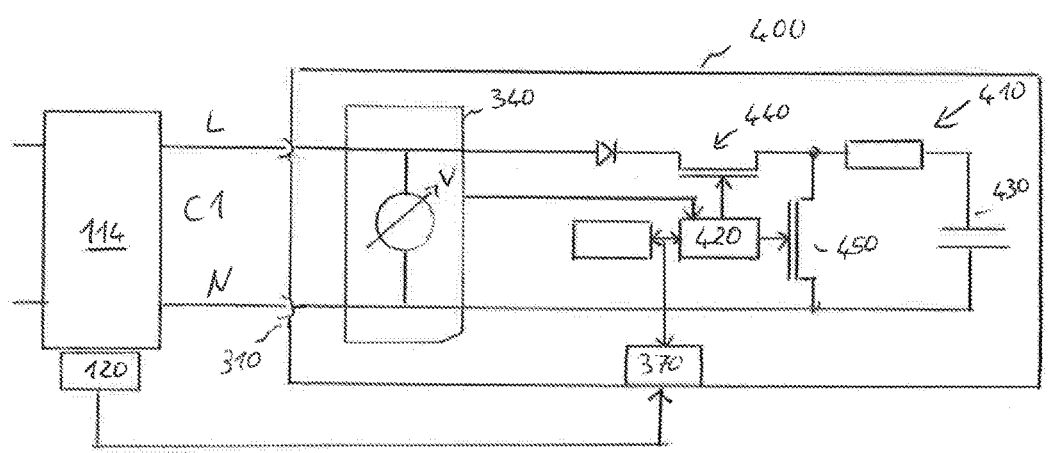
FIG. 4 shows another calibration unit of an energy metering system in accordance with an embodiment of the invention.

FIG. 4 shows an alternative calibration unit 400, which may be integrated into the electrical distribution panel 112, the data aggregation device 142 or the terminal 172. The components on the input side of the calibration 400 correspond to those of the calibration unit 300 described with reference to FIG. 3. For the sake of conciseness, a repetition of a description of these elements is omitted.

Contrary to the calibration unit 300 of FIG. 3, the calibration unit 400 of FIG. 4 comprises an internal load simulation circuit 410 that can be controlled by a micro-controller 420 to generate some predetermined load pattern. In this embodiment, it is sufficient to establish the reference voltage V by means of a voltage measuring circuit 340 at the plug connector 310. Based on the knowledge about the load simulation circuit 410 and a selected load pattern, the corresponding reference current and the electrical load on the circuit C1 may be established by the internal micro-controller 420 or an external data processing device.

In the embodiment shown in FIG. 4, the load simulation circuit 410 comprises a relatively large capacitive element 430 that may be charged by a first switch 440 and may be discharged by a second switch 450. By controlling the first and second switches 440 and 450 through the micro-controller 420, a predetermined load pattern for the circuit C1 can be emulated. Of course, other circuits may be used to generate one or several predetermined load patterns on the input side of the calibration unit 400.

Figure 5:
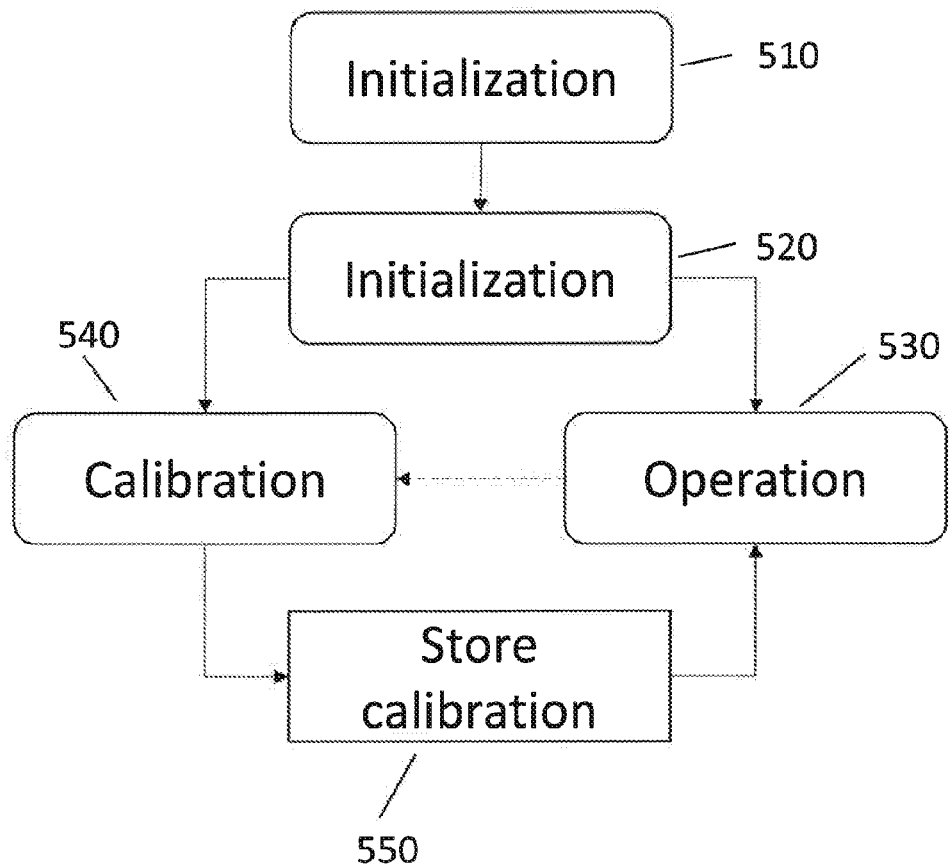
FIG. 5 shows a state diagram of an energy metering system in accordance with an embodiment of the invention.

FIG. 5 shows a state diagram of a data aggregation device 142 with a build-in calibration unit, for example the calibration unit 300 or 400. In other embodiment, the calibration unit may be integrated into other parts of the energy metering system 100, such as the terminal 172.

In a power-up state 510, the data aggregation device 142 is plugged into a wall socket 144. Alternatively, the data aggregation device 142 may be installed within the distribution panel 112, e.g. placed on a distribution rail or connected by wires to one of the circuits. Accordingly, the data aggregation device is provided with an operation voltage which may be detected by a primary voltage detection circuit of the calibration unit (not shown). On detection of the provided voltage, a data processing device such as the microcontroller 360 or 420 of the data aggregation device 142 enters an initialization state 520.

In the initialization state 520, the data processing device may establish communication channels with other components of the energy metering systems 100, such as the individual sensors 120 or sensor strips of the sensor subsystem 110, the terminal 172 of the data analysis subsection 170 and/or an external cloud service. In the described embodiment, each sensors 120 comprises an integrated controller. Theses controllers can be addressed by means of address lines configured as a daisy chain. Thus, the data processing device of the local data aggregation device 142 may establish the presence, number and relative position of sensors 120 by iteratively addressing each microcontroller of the row of sensors 120.

Moreover, the terminal 172 may be contacted by conventional network discovery methods. For example, the wireless transmission systems 146 and 172 may use a predetermined network identifier or key on power up. Such network identifiers may be stored in the respective devices by the manufacturer or may be configured by a user in a configuration mode. In case power line communication is employed by the data aggregation device 142 and the terminal 172, a unique signature transmitted over a power line may be used for pairing. Once the pairing has been established, associated communication parameters, such as a communication channel, network identifier and/or encryption key used may be stored in a non-volatile memory of the respective devices.

In addition to the physical connection, during a first initialization of the energy metering system 100, a user may be prompted to enter additional data about the distribution panel 112 or the energy distribution system 200 user an appropriate user interface, provided for example by the data aggregation device 142, the terminal 172 or a smartphone app as detailed in co-pending application EBL-002.

For example, on a first power-up of the system, the data aggregation device 142 might light up a LED of each identified sensor 120 in turn. For each sensor 120 indicated, a user is prompted to provide information regarding a corresponding circuit, e.g. the name of an area or electrical consumer protected by a corresponding circuit breaker 114. This information, together with an address of the corresponding sensor 120 is then stored in a non-volatile memory of the energy metering system 100 for later reference. For example, it may be used to display a measured energy consumption in an operation mode of the energy metering system 100 together with the name of the associated area or electrical consumer on a screen of the terminal 172 or a smartphone app. Inversely, the user may be prompted to mark a tag associated with the sensor 120 or circuit breaker 114 with the address of the sensor 120 determined by the energy metering system 100. Once the information for a given sensor 120 has been captured, the data aggregation device activates the LED of the next sensor 120, until information about all sensors has been captured.

While the establishment of connections and capturing of additional data about the system 100 has been described above with respect to the initialization state 520, in other embodiments, one or more of the steps described above may also be performed as part of the calibration mode 540 described below.

In the initialization state 520, the data processing device may optionally check whether calibration data for the energy metering system 100 is already stored in a non-volatile memory, for example the memory 380. If calibration data is already stored, i.e. from a previous calibration of the energy metering system 100, the energy metering system 100 may proceed directly to a normal operating mode 530, in which sensor data of the sensors 120 is converted into circuit specific load information based on the previously stored calibration data.

If the energy metering system 100 detects, in the initialization state 520, that no or unsufficient calibration data is stored in the memory, or if the data aggregation device 142 is configured to be re-calibrated on every power-up, it will enter a calibration mode 540. The energy metering system 100 remains in the calibration mode 540 until sufficient calibration data has been collected by the calibration unit. In a further embodiment, the energy metering system 100 may also re-enter the calibration mode 540 at regular intervals or perform an ongoing calibration process.

Once a correlation between sensor data of at least one sensor 120 of a sensor sub-system 110 and a reference current and reference voltage of a calibration unit has been established, the calibration data may be stored in an optional step 550 and the energy metering system 100 enters the normal operating mode 530. Preferably, the calibration data is stored at the same entity that also performs the conversion of magnetic sensor data into current data or other load information. For example, in a local installation, the individual sensors 120, the data aggregation device 142 or the terminal 172 may store the calibration data. If the data is fed back to the individual sensors 120, after the initial calibration the microprocessors of the sensors 120 may transform the measured magnetic field data directly into load information, thus alleviating the need for a complex post-processing. In a cloud based solution, the calibration data may be stored in cloud storage, allowing to implement more complex, big data based analysis methods. In case of a regular or ongoing calibration process, the calibration data may be updated when the need arises, possibly keeping historical calibration data.

Figure 6:
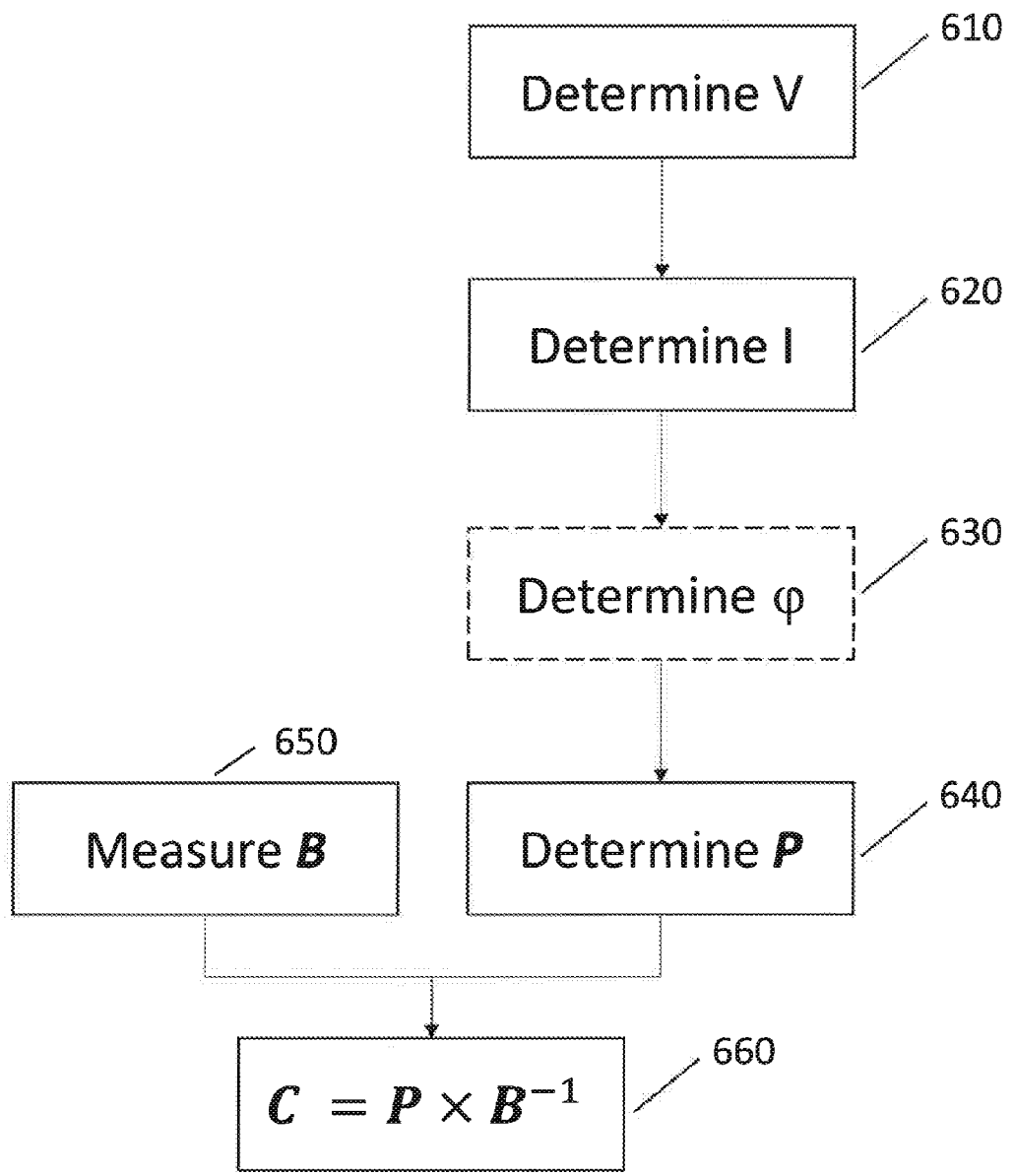
FIG. 6 shows a flow chart of an operation method for an energy metering system in a calibration mode.

FIG. 6 shows the steps performed in the calibration mode 540 in more detail.

In a first step 610, a reference voltage V of a circuit connected to the calibration unit is determined. For example, the voltage measuring circuit 340 may measure the line voltage between a phase line and a neutral conductor of the plug connector 310 plugged into the wall socket 144 connected to circuit C1 branching off the electrical distribution panel 112. In alternative embodiments, the reference voltage V may be provided by an external entity, such as a conventional smart meter or the sum measurement device 210.

In a subsequent step 620, a reference current I through a test load of the circuit C1 is determined. For example, an input current of an external load 330 may be measured by means of a current measuring circuit 350 as explained above with respect to FIG. 3. Alternatively, the reference current I may be computed based on knowledge about a load pattern implemented by a load simulation circuit 410 described above with respect to FIG. 4. Moreover, the reference current I may be provided by an external entity, such as a current transformer (CT) fitted around a circuit branching off the distribution panel 112, a conventional smart meter, or another sum measurement device 210.

In an optional step 630, a phase angle $\varphi$ between the established reference voltage V and reference current I may be determined. The phase angle $\varphi$ may be measured, computed or approximated based on knowledge of the specific load.

In a step 640, the current power consumption P of the load can be computed based on the parameters established in the previous steps. In particular in case of a non-ohmic consumer, the power P may be represented as a vector value, based on the input parameters provided in steps 310 to 330. Alternatively or in addition, the power factor for the circuit may also be computed.

In parallel, in a step 650, sensor data B of at least one sensor 120 attached to a circuit breaker 114 protecting the circuit C1 connected to the test load is gathered. According to the described embodiment, the obtained sensor data may comprise magnetic flux components for all three spatial dimensions of the magnetic field in the proximity of the circuit breaker 114. Accordingly, the sensor data B concerning the magnetic field strength may also be represented as a vector. The sensor 120 may be attached directly to a circuit breaker 114 protecting the individual branch circuit C1. Alternatively, the sensor 120 may also be placed on a mains circuit breaker 114a or residual-current circuit breaker all or a group of electrical circuits. At least in some embodiments, step 650 comprises obtaining sensor data B for all sensors 120 connected to the data aggregation device 142.

In a subsequent step 660, a correlation between the power P and the sensor data B may be established.

In case a sensor 120 placed on a mains circuit breaker 114a is used for calibration, the load pattern generated by the test load will always result in a corresponding sensor data of the sensor 120 placed on the mains circuit 114a breaker. In this case, by establishing a correlation between the load pattern and the sensor data associated with the mains circuit breaker 114*a*, the energy metering system may be calibrated. The reaming sensors 120 associated with individual branch circuits C1 to C6 may then be calibrated by comparing the known load of the mains circuit breaker 114*a* with the relative loads of the individual, secondary circuit breakers 114. For example, if the current through the mains circuit breaker 114*a* rises by a known amount, e.g. 1 A, the calibration algorithm may established, which of the sensors 120 also sees a rising current at the same time. Assuming that the increased current is caused by a single circuit, e.g. C1, the corresponding sensor 120 may be calibrated by noting that the observed magnetic field data corresponds to a change in current for C1 by 1 A.

In case no mains circuit breaker exists, no sensor is placed on a mains circuit breaker or the topology of the energy distribution system 200 is unknown, step 660 may comprises a preliminary analysis as to which circuit and/or phase of a multi-phase supply network the calibration unit 300 or 400 is connected. For this purpose, a signature of a load pattern generated or determined in steps 610 to 640 may be compared with the sensor data of each sensor obtained in step 650. Typically, the highest correlation between sensor data B of any one sensor and the load pattern will indicate the specific sensor 120 attached to the circuit breaker 114 protecting the circuit connected to the calibration unit 300 or 400.

In a similar way, e.g. by establishing a cross-correlation between sensor data B provided by different sensors 120, it is also possible to determine a hierarchy of sensors, such as a primary mains sensor and secondary sensors 120 for individual circuits C1 to C6. Furthermore, it is possible to determine which of the sensors 120 are protecting circuits belonging to the same phase of a multi-phase supply network and which belong to different phases. Similarly, by establishing the timing of load peaks for each phase of a multi-phase supply network, both the number and relative phase angles between all the phases may be established. In other words, the energy metering system 100 is self-learning the configuration of the energy distribution system 200 monitored. The allocation of sensors 120 to individual phases of a multi-phase energy distribution system 200 may be stored persistently in a configuration table, for example in the memory 380 or a database system used for storing and processing the subsequently obtaining load information.

In order to establish an actual calibration for the sensors 120, once the relevant sensor 120 has been identified, a more specific analysis of the corresponding sensor data B may be performed. In the described embodiment, both the calculated power P as well as the sensor data B is represented as a vector. Therefore, conceptually a matrix C may be established by means of a vector product between the power vector P and the inverse $B^{-1}$ of the sensor data B. More specifically, the process for self-learning of a calibration matrix disclosed in US 2013/0229173 A1 by Paul Bertrand may be employed. Said matrix C may be used as calibration data for establishing the correlation between the measured magnetic field at a sensor 120 and the load of a corresponding circuit C1. Like the other information determined in the calibration mode, the matrix C may be stored persistently in a calibration table or other suitable data structure, for example in the memory 380 or a database system used for storing and processing the subsequently obtaining load information.

In order to establish a more precise correlation and also to identify systematic offsets, such as permanent magnetic fields present in the vicinity of the circuit breakers 114, the steps mentioned above may be repeated several times.

Furthermore, sensor data of further sensors 120, in particular sensors 120 arranged directly before and/or after the sensor 120 used to protect the circuit with the test load may be considered to cancel out any interference from neighboring circuits. In particular in these cases, more complicated statistical analysis methods may be employed in order to establish a correlation between the sensor data B provided by the at least one sensor 120 and the reference measurements provided by the calibration unit. In addition, the sensor data B of one or more individual sensors 120 may be correlated with sum data provided by a smart meter or another sum measurement device 210 measuring the overall power consumption of one or all phases of a supply network.

If no calibration data for a mains circuit breaker can be established, an individual circuit, e.g. C1, may be calibrated as described above with respect to the mains circuit breaker 114*a*. In this case, the calibration data obtained for the circuit C1 may also be used for other circuits C2 to C6, in particular if the circuit breakers 114 and sensors 120 have comparable electrical and magnetic characteristics.

Figure 7:
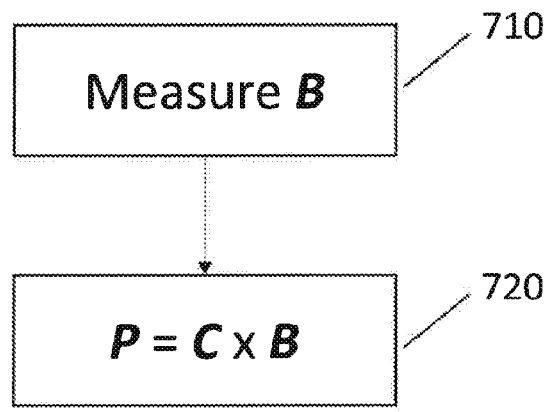
FIG. 7 shows a flow chart of an operating method of an energy metering system in a normal operating mode.

FIG. 7 shows a flow chart of the energy metering system 100 in the normal operation mode 530. In operation, the information about the electric load of a particular circuit may be established alone based on provided sensor data B.

For this purpose, in a step 710 a magnetic field is measured by a sensor 120 arranged in the proximity of a circuit breaker 114 of a particular circuit. Based on the measurement, corresponding sensor data B is provided by the sensor 120 for further processing.

In a subsequent step 720, the sensor data B, in the given example again a three-dimensional vector value, may be multiplied with the calibration data C, in the example a matrix, in order to establish the instantaneous current I or power P representative of the electrical load of the respective circuit. In case a current is obtained, this may be multiplied with the measured or known line voltage at a later processing state to obtain the corresponding power P.

Attention is drawn to the fact that, in the normal operating mode 530, there exists no need to provide a reference current to the data processing system. However, in case the calibration unit is permanently attached to the energy metering system 100, the continuous provision of a reference voltages and/or a reference current may help to improve the accuracy of the determined load information and support a regular or ongoing calibration process. In particular, by means of the voltage, the measured current may be transformed into the measured power of a given circuit. Moreover, by means of a constant or repeated voltage measurement through a voltage measuring circuit 340, variations in the supply voltage provided by a utility provider may be detected and used to correct the load information computed based on the sensor data B. Even in case the calibration unit is not permanently connected to the energy distribution system 200, other available data, such as output data of a smart meter or another sum measurement device 210 may be used to verify the load information calculated by the energy metering system 100.

As detailed above, the various components of the described energy metering system 100 are particularly easy to install, even by a consumer. In particular, it is not necessary to open the distribution panel 112 or disconnect any wires of the energy distribution system 200 in order to perform the installation. This eliminates the risk of an electrical shock and the requirement for a specialized or certified technician.

For example, as detailed above with respect to FIG. 1, the individual sensors 120 used for monitoring the circuits branching off the respective circuit breakers 114 may be simply attached to the front of the circuit breakers 114 by means of a double-sided adhesive tape or Velcro fastener. Moreover, if the calibration unit 300 or 400 is integrated into a data aggregation device 142 or a terminal 172 plugged into a wall socket 144 connected to one of the electric circuits of the distribution panel 112, no further connection between the energy metering system 100 and the electrical energy distribution system 200 needs to be established.

In other words, the energy metering system 100 represents a so-called plug-and-play solution, which requires no dismantling of the distribution panel 112 and can be installed by practically anybody, including individual consumers. All that is necessary for the installation is the attachment of the sensors 120 to the circuit breakers 114, the relatively simple connection of the sensors 120 to the junction box 126 and the data aggregation device 142 and the plugging of the data aggregation device 142 and terminal 172 into respective wall sockets 144. Of course, the terminal 172 and the data aggregation device 142 may also be integrated into a single device, further minimizing the effort required for setting up the energy metering system 100.

As detailed above with respect to the various embodiments described, the data processing, i.e. the calibration as well as the conversion of the sensor data into electrical load information may be performed by either the data aggregation device 142 or the terminal 172. Furthermore, the data processing may also be performed by an external service provide such as a utility metering company, for example via a cloud service. In this embodiment, either the aggregation device 142 or the terminal 172 may be configured to forward the sensor data obtained by the sensors 120 to a wide area network, in particular the Internet.

In case the sensor data is transmitted through a public network such as the Internet, data encryption can be applied by the data aggregation device 142 or the terminal 172 or any other device used for forwarding the data to a service provider. Of course, for the sake of increased security, data encryption may also be applied for communication between the data aggregation device 142 and the terminal 172, in particular in case of a wireless connection between them.

The energy metering system 100 described above allows the implementation of many novel applications, such as a fine grained analysis of the power consumption of a particular site, sub-unit, user, circuit, or electric device.

For example, energy consumption in different rooms of a building or apartment may be analyzed. Moreover suspicious activity may be detected automatically by noticing a high power consumption at unusual times or at unusual location. One further application is the indirect detection of the presence or absence of people in a particular part of a building, based on the electrical power consumption.

Moreover, based on a comparison of load information of a particular site with those of other sites or average values, a consumer may be provided with suggestions in order to reduce his own energy consumption and therefore help to reduce the generation of greenhouse gases. Similarly, a user may also provide information about an individual budget, for example by means of the terminal 172 or a web service. In this case, the energy metering system 100 may draw the user's attention to a high energy consumption before the preset power budget is exceeded, enabling the consumer to reduce his energy uptake to stay within an agreed budget. In addition, a supplier may predict the power needs of a particular consumer based on historical records of this consumer and potential further information, such as weather or temperature data.

In addition, an energy usage may be monitored over time with a high resolution, e.g. each minute, second or even more often, e.g. with a frequency of 100 Hz or more. By monitoring circuit specific load information over time, unusual events such as faults or wear out of appliances may be detected by noticing a sudden or slow drop or increase of associated electrical loads. With even higher sampling frequencies, such as several kHz, a harmonic analysis of the switch-on characteristic of individual electric devices may be performed, allowing to identify individual devices even when they are connected to the same circuit. Such an analysis may be based on a Fourier transformation of the obtained currents.

While the energy metering system 100 has been described with respect to various, currently preferred embodiments, attention is drawn to the fact that the described system may be altered in several ways without departing from the inventive concepts disclosed herein. In particular, in contrast to a plug-and-play installation, the system may also make use of fixedly installed current transformers in order to establish a reference current. Moreover, the calibration unit may be integrated into other devices, such as the smart meter or the sum measurement device 210 or be provided as a separate device permanently connected to the electrical energy distribution system 200.

LIST OF REFERENCE SIGNS 100 energy metering system
110 sensor sub-system
112 distribution panel
114 circuit breaker
114a mains circuit breaker
120 sensor
122 connection cable
124 connection cable
126 junction box
130 feed cable
140 data collection sub-system
142 data aggregation device
144 wall socket
146 wireless transmission system
170 data collection sub-system
172 remote terminal
174 wireless transmission system
176 backplate
178 AD/DC adapter
180 supply cable
200 energy distribution system
210 sum measurement device
300 calibration unit
310 plug connector
320 socket
330 external load
340 voltage measuring circuit
350 current measuring circuit
360 micro-controller
370 interface
380 memory
400 calibration unit
410 load simulation circuit
420 micro-controller
430 capacitive element
440 first switch
450 second switch

What is claimed is:

1. An energy metering system for determining electrical loads of a distribution panel, the energy metering system comprising:
   a plurality of sensors for sensing a magnetic field emitted by circuit breakers of the distribution panel and providing corresponding sensor data, wherein each one of the plurality of sensors is attached to a housing of a corresponding circuit breaker and configured to measure a magnetic field emitted by the corresponding circuit breaker, wherein the plurality of sensors are configured for sensing a magnetic field emitted by a protective coil or other internal component of circuit breakers;
   a data processing system for converting the sensor data of the plurality of sensors into electrical load information for each one of a plurality of electrical circuits branching off the distribution panel and being protected by a corresponding circuit breaker; and
   a calibration device electrically connected to a first circuit of the plurality of circuits branching off the distribution panel and coupled with the data processing system, the calibration device being configured to determine at least a reference voltage and a reference current of the first circuit of the plurality of circuits branching off the distribution panel,
   wherein the data processing system is configured to determine a load pattern of the first circuit computed based on the reference voltage and reference current determined by the calibration device, to perform a preliminary analysis as to which circuit of the plurality of circuits the calibration device is connected to by comparing the determined load pattern of the first circuit with the sensor data of each sensor of the plurality of sensors, and to calibrate a relationship between the sensor data provided by at least a first sensor of the plurality of sensors and the load pattern of the load of the first circuit to which the calibration device is connected to.

2. The energy metering system according to claim 1, wherein the data processing system comprises a local data aggregation device, and wherein the calibration device is integrated into the local data aggregation device.

3. The energy metering system according to claim 2, wherein the local data aggregation device comprises a primary circuit and a plug connector for connecting the local data aggregation device to a socket, and wherein the primary circuit is configured to supply an operating energy to the local data aggregation device and to measure a primary voltage applied to the plug connector.

4. The energy metering system according to claim 3, wherein the primary circuit is further configured to detect a connection of the plug connector to a supply voltage provided by the socket, and wherein the calibration device is configured to initiate a calibration mode on detection that the local data aggregation device has been connected to the supply voltage.

5. The energy metering system according to claim 2, wherein the local data aggregation device is further configured, in a calibration mode, to locally perform a calibration process based on the reference voltage and the reference current and, in a normal operating mode, to locally convert the sensor data of the plurality of sensors into electrical load information for the plurality of electrical circuits based on the result of the calibration process.

6. The energy metering system according to claim 2, wherein the data processing system further comprises a remote data analysis device, the local data aggregation device and the remote data analysis device being connected by at least one data connection, the remote data analysis device being configured, in a calibration mode, to perform a calibration process based on the reference voltage and the reference current provided by the local data aggregation device and, in a normal operating mode, to convert the sensor data of the plurality of sensors into electrical load information for the plurality of electrical circuits based on the result of the calibration process.

7. The energy metering system according to claim 1, wherein the calibration device comprises a voltage measuring circuit configured to measure a line voltage of the circuit to which the calibration device is connected to and to provide the measured line voltage as the reference voltage to the data processing system.

8. The energy metering system according to claim 7, wherein the calibration device is further configured to apply a predetermined load pattern to the circuit to which the calibration device is connected to during the calibration process.

9. The energy metering system according to claim 7, wherein the calibration device further comprises a socket for connecting an external load and a current measurement circuit configured to measure a current flowing through the external load, wherein the calibration device is further configured to determine the reference current based on the current flowing through the external load.

10. The energy metering system according to claim 1, wherein at least one of the calibration device and the processing system is further configured to determine at least one of a phase angle between the reference voltage and the reference current, and a frequency of the reference voltage.

11. The energy metering system according to claim 1, comprising at least one further sensor configured to detect at least one of a presence of an operator in proximity of the distribution panel and an opening of a cover of the distribution panel, wherein the data processing system is configured to perform at least one of the following steps, in case the at least one sensor indicates the presence of an operator or the opening of a cover: interrupting the conversion of the sensor data of the plurality of sensors into electrical load information; recalibrating the relationship between the sensor data and the load information; and converting the sensor data of the plurality of sensors into electrical load information based on calibration data associated with an opened state of the cover.

12. The energy metering system according to claim 1, wherein the data processing system comprises a local data aggregation device, and wherein the calibration device is part of a smart meter or a sum measurement device which is independent from the local data aggregation device.

13. A method for calibrating an energy metering system, the method comprising:
   determining, by a calibration device, a reference voltage and a reference current of a first circuit of a plurality of circuits branching off an electrical distribution panel;
   sensing a magnetic field emitted by each one of a plurality of circuit breakers, each of the plurality of circuit breakers configured to protect at least one circuit of the plurality of circuits, and providing corresponding sensor data, wherein the corresponding sensor data is provided by a plurality of sensors, each sensor of the plurality of circuit breakers being attached to a housing of a corresponding circuit breaker and configured to measure a magnetic field emitted by a protective coil or other internal component of the corresponding circuit breaker;

determining an electrical load pattern for the first circuit computed based on the determined reference voltage and the reference current;

performing a preliminary analysis as to which circuit of the plurality of circuits the calibration device is connected to by comparing the determined electrical load pattern of the first circuit with the sensor data of each sensor of the plurality of sensors;

determining calibration data representative of a relationship between first sensor data provided by a first sensor of the plurality of sensors in a calibration mode of the energy metering system and the determined electrical load pattern;

based on the determined calibration data, converting first sensor data provided by the first sensor in a normal operating mode of the energy metering system into first load information for the first circuit; and based on the determined calibration data, converting second sensor data corresponding to a magnetic field emitted by a second circuit breaker into second load information in the normal operating mode of the energy metering system, wherein the second sensor data is provided by a second sensor of the plurality of sensors.

14. The method according to claim 13, wherein first circuit breaker is a mains circuit breaker protecting all or a group of circuits branching off the of the electrical distribution panel and the second circuit breaker is a secondary circuit breaker protecting only the first or a second circuit branching off the electrical distribution panel; and, in the step of converting, based on the calibration data determined for the mains circuit breaker, a calibration of the second circuit breaker is determined by relating a measured change of load for the mains circuit breaker to a change of sensor data obtained by the second sensor.

15. The method according to claim 13, wherein a first circuit breaker of the plurality of circuit breakers is protecting only the first circuit branching off the electrical distribution panel and the second circuit breaker is protecting only a second circuit branching off the electrical distribution panel; and, in the step of converting, the calibration data determined for the first circuit breaker is also used for converting the second sensor data into the corresponding second load data.

16. The method according to claim 13, wherein the steps of measuring, sensing, determining, calibrating, and storing are performed automatically on connection of a calibration device of the energy metering system to the first circuit.

17. A data aggregation device for an energy metering system, the data aggregation device comprising:

at least one bus connector for connecting a plurality of sensors for sensing a magnetic field in an area of circuit breakers of an electrical distribution panel to the data aggregation device, each one of the plurality of sensors being attached to a housing of a corresponding circuit breakers of the electrical distribution panel and configured for sensing a magnetic field emitted by the corresponding circuit breaker, wherein the plurality of sensors are configured for sensing a magnetic field emitted by a protective coil or other internal component of circuit breakers;

at least one plug connector for connecting the data aggregation device to a first circuit of a plurality of circuits branching off the electrical distribution panel;

a calibration device electrically connected to the plug connector, the calibration device comprising a circuit for determining a reference voltage and a reference current of the first circuit;

at least one interface for providing sensor data provided by the plurality of sensors and a reference current and reference voltage determined by the calibration device for calibrating a relationship between the provided sensor data and electrical load information for the first circuit in a calibration mode of the energy metering system and for converting the provided sensor data into electrical load information of the plurality of electrical circuits protected by corresponding circuit breakers in a normal operation mode of the energy metering system; and at least one data processing device connected to the at least one bus connector and the calibration device by the at least one interface, wherein the at least one data processing device is configured to determine a load pattern of the first circuit computed based on the reference voltage and reference current determined by the calibration device, to perform a preliminary analysis as to which circuit of the plurality of circuits the calibration device is connected to by comparing the determined load pattern of the first circuit with the sensor data of each sensor of the plurality of sensors, and to calibrate a relationship between the sensor data provided by at least a first sensor of the plurality of sensors and the load pattern of the load of the first circuit to which the calibration device is connected to.

18. The data aggregation device according to claim 17, wherein the at least one interface comprises a data network interface, wherein the data network interface is configured to transmit at least one of the provided sensor data, the determined load information, the established reference current, and the established reference voltage to a remote data analysis device connected to the data aggregation device by at least one data network.

19. The energy metering system according to claim 1, wherein a first circuit breaker of the plurality of circuit breakers is a mains circuit breaker protecting the first and at least second circuits branching off a phase line of the electrical distribution panel and a second circuit breaker protects only the first circuit or the second circuit.

20. The energy metering system according to claim 1, wherein a first circuit breaker of the plurality of circuit breakers is protecting only the first circuit branching off a phase line of the electrical distribution panel and a second circuit breaker protects only a second circuit branching off the electrical distribution panel.

21. The method according to claim 13, wherein the step of determining calibration data comprises:

establishing a correlation between the determined electrical load pattern and the first sensor data provided in the calibration mode; and establishing a cross-correlation between at least the first and second sensor data provided in the calibration mode.

22. The method according to claim 13, wherein the preliminary analysis comprises, identifying a highest correlation between sensor data of any one sensor of the plurality of sensors and the load pattern to indicate a specific sensor attached to the circuit breaker protecting the first circuit connected to the calibration device.

23. The method according to claim 13, further comprising establishing a cross-correlation between sensor data provided by different sensors of the plurality of sensors to determining a hierarchy of sensors, between a primary mains sensor attached to a mains circuit breaker and a secondary sensor attached to the secondary circuit breaker, wherein first circuit breaker is the mains circuit breaker.

24. The method according to claim 13, further comprising determining which of the sensors of the plurality of sensors are protecting circuits of the plurality of circuits belonging to the same phase of a multi-phase supply network and which belong to different phases.

* * * * *